(12) United States Patent
Kim et al.

(10) Patent No.: US 8,031,285 B2
(45) Date of Patent: Oct. 4, 2011

(54) THIN FILM TRANSISTOR SUBSTRATE, METHOD OF MANUFACTURING THE SAME, AND LIQUID CRYSTAL DISPLAY PANEL HAVING THE SAME

(75) Inventors: Bong Ju Kim, Suwon-si (KR); Chun Gi You, Hwaseoung (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 951 days.

(21) Appl. No.: 11/860,864

(22) Filed: Sep. 25, 2007

(65) Prior Publication Data

US 2008/0074572 A1  Mar. 27, 2008

(30) Foreign Application Priority Data

Sep. 26, 2006  (KR) .................. 10-2006-0093519

(51) Int. Cl.
*G02F 1/136* (2006.01)
(52) U.S. Cl. ............... 349/44; 349/141; 349/38; 349/43
(58) Field of Classification Search .......... None
See application file for complete search history.

(56) References Cited

U.S. PATENT DOCUMENTS

| | | | |
|---|---|---|---|
| 6,233,034 B1 * | 5/2001 | Lee et al. | 349/141 |
| 6,462,800 B1 * | 10/2002 | Kim et al. | 349/143 |
| 6,562,645 B2 * | 5/2003 | Sung et al. | 438/30 |
| 7,659,959 B2 * | 2/2010 | Kim et al. | 349/141 |
| 2002/0089631 A1 * | 7/2002 | Lee et al. | 349/141 |
| 2004/0169808 A1 * | 9/2004 | Shih et al. | 349/141 |

* cited by examiner

*Primary Examiner* — Thanh-Nhan Nguyen
(74) *Attorney, Agent, or Firm* — H.C. Park & Associates, PLC

(57) ABSTRACT

This invention relates to a thin film transistor substrate, a method of manufacturing the same, and a liquid crystal display panel including the same. The thin film transistor substrate includes a substrate, gate lines disposed on the substrate and extending in one direction, common voltage lines disposed on the substrate and spaced apart from the gate lines, and a gate insulating film disposed on the gate lines and the common voltage lines, the gate insulating film having first contact holes exposing a part of each common voltage line. Common electrodes are disposed on the gate insulating film and are connected to the common voltage lines through the first contact holes. Data lines are disposed on the gate insulating film and extend in a direction crossing the gate lines and thin film transistors are disposed at crossings of the gate lines and the data lines. The thin film transistors are connected to the gate lines and the data lines and include source electrodes and drain electrodes. Pixel electrodes are connected to the thin film transistors.

9 Claims, 16 Drawing Sheets

THIN FILM TRANSISTOR SUBSTRATE, METHOD OF MANUFACTURING THE SAME, AND LIQUID CRYSTAL DISPLAY PANEL HAVING THE SAME

CROSS REFERENCE TO RELATED APPLICATION

This application claims priority from and the benefit of Korean Patent Application No. 10-2006-0093519, filed on Sep. 26, 2006, which is hereby incorporated by reference for all purposes as if fully set forth herein.

BACKGROUND OF THE INVENTION

1. Field of the Invention

The invention relates to thin film transistor substrates, methods of manufacturing thin film transistor substrates, and liquid crystal display panels including thin film transistor substrates. More particularly, the invention relates to a thin film transistor substrate having a structure in which a common electrode is disposed on a gate insulating layer and is connected to a common voltage line through a contact hole, as well as a method of manufacturing such a thin film transistor substrate and a PLS (plane-to-line switching) mode liquid crystal display panel including such a thin film transistor substrate.

2. Discussion of the Background

In order to improve the viewing angle of a liquid crystal display panel, different wide viewing angle technologies, such as in-plane switching (IPS) mode, fringe-field switching (FFS) mode, and patterned vertical alignment (PVA) mode, have been developed.

However, the above wide angle viewing technologies present challenges. For example, a field distortion in the upper part of an electrode may be caused due to a mode characteristic that uses a lateral field of the electrode, thereby causing the region that actually transmits backlight to be limited.

Therefore, recently, a plane-to-line switching (PLS) mode that utilizes the dead space of the electrode as an opening has been developed.

In PLS mode, a plane-shaped common electrode and a linear pixel electrode are disposed on a thin film transistor substrate. Liquid crystal molecules are aligned by an electrical field generated when voltages are applied to the electrodes. The PLS mode is advantageous because it removes the dead space of an electrode in IPS mode by using an additional common electrode.

In the PLS mode liquid crystal displays of the prior art a common electrode is formed first and then a gate line is formed. Thereafter, three layers, including a gate insulating layer, an active layer, and an ohmic contact layer, are sequentially deposited on the common electrode at a high temperature, for example, at 350° C. or higher.

In this case, if the common electrode, for example, an indium tin oxide (ITO), is exposed to a high temperature, the bonding strength between the compositions may weaken, and thus, the indium ion or the tin ion may damage the other layers. In order to prevent this damage, the three layers may be deposited at a lower temperature, for example, at 280° C. However, even if the weakening of the bonding strength between the compositions can be prevented, the interface properties of the three layers, including an active layer formed of amorphous silicon, is remarkably degraded, which may degrade the reliability of the thin film transistor.

SUMMARY OF THE INVENTION

This invention provides a thin film transistor substrate, which may maintain both the bonding strength between the compositions of the common electrode and the interface properties of the ohmic contact layer, the active layer, the gate insulating layer.

This invention also provides a method of manufacturing such a thin film transistor substrate.

The present invention also provides a liquid crystal display panel including such a thin film transistor.

Additional features of the invention will be set forth in the description which follows, and in part will be apparent from the description, or may be learned by practice of the invention.

This invention discloses a thin film transistor substrate including a substrate, gate lines disposed on the substrate and extending in a first direction, common voltage lines disposed on the substrate and spaced apart from the gate lines, and a gate insulating film disposed on the gate lines and the common voltage lines, the gate insulating film having first contact holes exposing a part of each of the common voltage lines. The thin film transistor substrate further includes common electrodes disposed on the gate insulating film and connected to the common voltage lines through the first contact holes, data lines disposed on the gate insulating film and extending in a second direction crossing the gate lines, thin film transistors disposed at the crossings of the gate lines and the data lines, the thin film transistors being connected to the gate lines and the data lines and including source electrodes and drain electrodes, and pixel electrodes connected to the thin film transistors.

The present invention also discloses a method of manufacturing a thin film transistor substrate including disposing gate lines extending in a first direction on a substrate and disposing gate electrodes and common voltage lines on the substrate such that they are spaced apart from the gate lines. The method further includes sequentially disposing a gate insulating film, an active layer, and an ohmic contact layer on the gate lines and the common voltage lines to form active regions of thin film transistors. First contact holes exposing a part of each of the common voltage lines are formed in the gate insulating film and data lines extending in a second direction and crossing the gate lines are disposed on the substrate. The data lines include source electrodes, drain electrodes, and common electrodes, the common electrodes being connected to the common voltage lines through the first contact holes. A passivation film is disposed on the data lines and the common voltage lines and includes second contact holes exposing a part of each of the drain electrodes. Pixel electrodes are disposed on the substrate and connected to the drain electrodes through the second contact holes.

The invention also discloses a liquid crystal display panel including a thin film transistor substrate, a color filter substrate, and liquid crystal injected between the thin film transistor substrate and the color filter substrate. The thin film transistor substrate includes a first substrate, gate lines disposed on the first substrate and extending in a first direction, common voltage lines disposed on the substrate and spaced apart from the gate lines, and a gate insulating film disposed on the gate lines and the common voltage lines, the gate insulating film having first contact holes exposing a part of each of the common voltage lines. The thin film transistor substrate further includes common electrodes disposed on the gate insulating film and connected to the common voltage lines through the first contact holes, data lines disposed on the gate insulating film and extending in a second direction crossing the gate lines, and thin film transistors disposed at the crossings of the gate lines and the data lines. The thin film transistors are connected to the gate lines and the data lines and include source electrodes and drain electrodes, and pixel electrodes are connected to the thin film transistors. The color filter substrate is arranged opposite the thin film transistor substrate and includes a second substrate, a black matrix disposed on the second substrate, a plurality of color filters disposed on the second substrate and the black matrix, and an overcoat film disposed on the plurality of color filters.

The invention also discloses a thin film transistor substrate comprising a substrate, gate lines formed on the substrate so as to extend in one direction, common voltage lines formed on the substrate so as to be spaced apart from the gate lines, a gate insulating film formed on the gate lines and the common voltage lines, common electrodes formed on the gate insulating film, data lines formed on the gate insulating film so as to extend in a direction intersecting the gate lines, thin film transistors formed at intersections of the gate lines and the data lines, connected to the gate lines and the data lines, and comprising source electrodes and drain electrodes, a passivation film formed on the thin film transistors and the common electrodes, and pixel electrodes formed on the passivation film and comprising a plurality of pixel electrode patterns and a bridge electrode pattern spaced apart from the pixel electrode patterns, wherein the bridge electrode pattern is formed so as to connect the common voltage lines and the common electrodes, and the plurality of pixel electrode patterns are formed so as to be connected to the drain electrodes.

The invention also discloses a method of manufacturing a thin film transistor substrate comprising forming gate lines that extend in a direction on a substrate and include gate electrodes and common voltage lines that are spaced apart from the gate lines, sequentially forming a gate insulating film, an active layer, an ohmic contact layer and a conductive layer on the gate lines and the common voltage lines and then forming data lines that extend in a direction crossing the active regions of thin film transistors and the gate lines and include source electrodes and drain electrodes, forming common electrodes on the gate insulating film, forming a passivation film on the thin film transistor and the common electrodes and then forming first contact holes that expose a part of the common voltage lines, second contact holes that expose a part of the common electrodes, and third contact holes that expose a part of the drain electrodes, and forming pixel electrodes comprising a plurality of pixel electrode patterns and a bridge electrode pattern that is spaced apart from the plurality of pixel electrode patterns on the passivation film, wherein the bridge electrode pattern is formed on the first contact holes and the second contact holes to connect the common voltage lines and the common electrodes through the first contact holes and the second contact holes, and a part of the plurality of pixel electrode patterns is formed on the third contact holes to be connected to the drain electrode through the third contact holes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
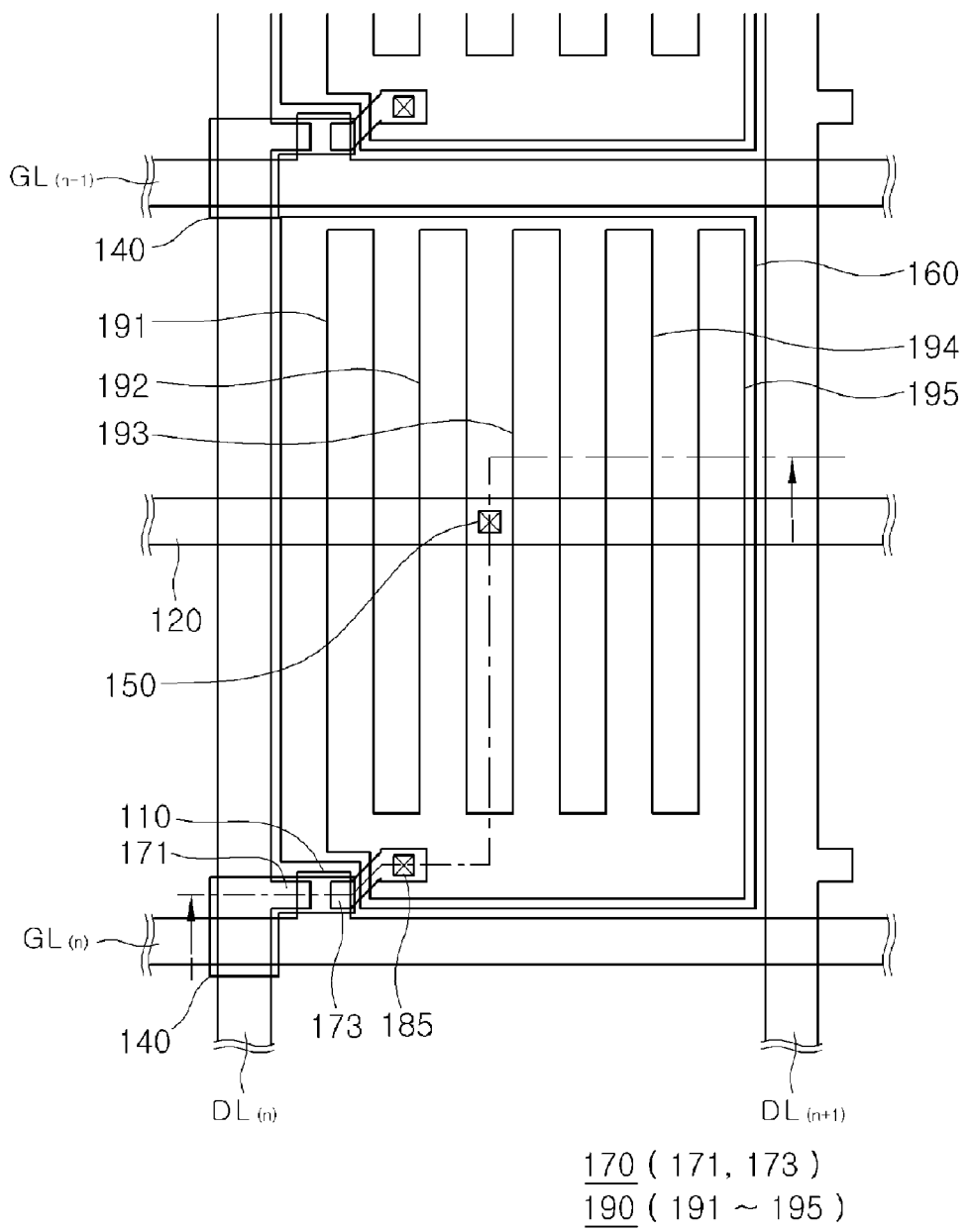
FIG. 1 is a plan view showing a thin film transistor substrate according to an exemplary embodiment of the invention.

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Hereinafter, exemplary embodiments of the invention will be described in detail with reference to the accompanying drawings.

Figure 2:
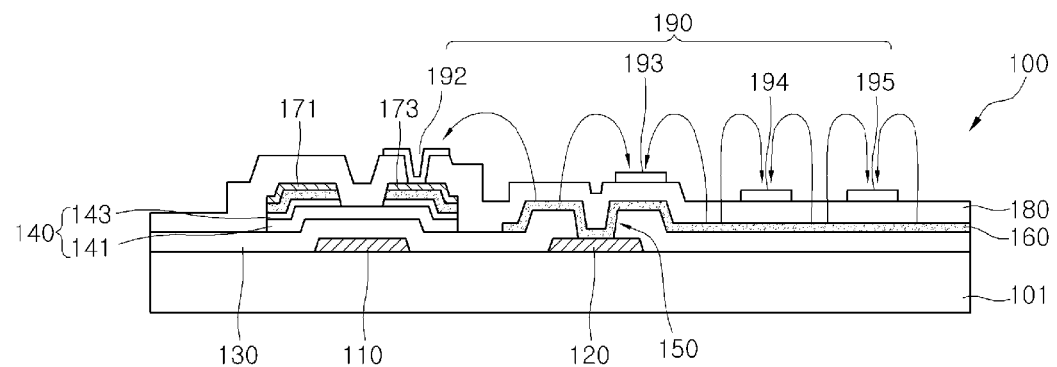
FIG. 2 is a cross-sectional view taken along line I-I of FIG. 1.

FIG. 1 is a plan view showing a thin film transistor substrate according to an exemplary embodiment of the invention and FIG. 2 is a cross-sectional view taken along line I-I of FIG. 1.

Referring to FIG. 1 and FIG. 2, a thin film transistor substrate 100 includes a transparent insulating substrate 101, gate lines GL, common voltage lines 120, a gate insulating film 130, common electrodes 160, data lines DL, thin film transistors, a passivation film 180, and pixel electrodes 190. The gate lines GL are disposed on the substrate 101, extend in one direction, and include gate electrodes 110. The common voltage lines 120 are disposed on the substrate and spaced apart from the gate lines GL. The gate insulating film 130 is disposed on the gate lines GL and the common voltage lines 120 and has first contact holes 150, which expose a part of the common voltage lines 120. The common electrodes 160 are disposed on the gate insulating film 130 and are connected to the common voltage lines 120 through the first contact holes 150. The data lines DL are disposed on the gate insulating film 130, extend in a direction crossing the gate lines GL, and include source electrodes. The thin film transistors are disposed at the crossings of the gate lines GL and the data lines DL and are connected to the gate lines GL and the data lines DL. Each thin film transistor includes a gate electrode 110, a source electrode 171, and a drain electrode 173. The passivation film 180 is disposed on the thin film transistors and the common electrodes 160 and includes second contact holes 185, which expose a part of each drain electrode 173. The pixel electrodes 190 are disposed on the passivation film 180 and are connected to the drain electrodes 173 of the thin film transistors through the second contact holes 185.

The gate lines GL are disposed on the substrate 101 and extend in the horizontal direction. A gate pad (not shown) is disposed at one end of each gate line GL. The common voltage lines 120 extend between the gate lines GL. In this exemplary embodiment, the common voltage lines 120 extend in a horizontal direction like the gate lines, but the configuration of the common voltage lines 120 is not limited thereto.

The gate insulating film 130 is disposed on the gate lines GL and the common voltage line 120. Then, an active layer 141 and an ohmic contact layer 143 are formed on the gate insulating film 130 and patterned to form an active region 140. Further, the first contact hole 150 is formed in the gate insulating film 130.

The data lines DL are disposed in the vertical direction on the gate insulating film 130 and a data pad (not shown) is disposed at one end of each data line DL. In this case, the data lines DL are formed of a double conductive film, and the lower conductive film is used as the common electrode 160.

The source electrode 171 and the drain electrode 173 are made of a double conductive film and are disposed in the active region 140 of the thin film transistor. In a predetermined region of the gate insulating film 130, other than the active region 140, a common electrode 160 having a plane-shape, for example, polygon such as a rectangle, a square, etc., is disposed. The common electrode 160 is connected to the common voltage line 120 through the first contact hole 150 formed in the gate insulating film 130. Further, as described in this exemplary embodiment, the common electrodes 160 may be disposed at the crossings of the gate lines GL and the data lines DL.

As described above, when triple layers, including the gate insulating film 130, the active layer 141, and the ohmic contact layer 143, are formed and then the common electrodes are formed, there may be no damage to the common electrodes, even though the triple layers are deposited at a high temperature. Further, the triple layers may be deposited at a low temperature in consideration of the common electrode. Therefore, it is possible to maintain the bonding strength between the compositions inside the common electrode while also maintaining the interface properties of the triple layers, which thereby may improve the reliability of the thin film transistor.

Each of the above described thin film transistors includes a gate electrode 110 connected to the gate line GL, a source electrode 171 connected to the data line DL, a drain electrode 173 connected to the pixel electrode 190, a gate insulating layer 130 and an active layer 141 that are sequentially disposed between the gate electrode 110 and the source and drain electrodes 171 and 173, and an ohmic contact layer 143 that is disposed on at least a part of the active layer 141. The ohmic layer 143 may also be disposed on a portion of the active layer 141 other than a channel portion.

The passivation film 180 is disposed on the thin film transistors and the common electrodes 160. The second contact holes 185, which expose a part of each drain electrode 173, are formed in the passivation film 180 and the pixel electrodes 190 are disposed on the passivation film 180.

The pixel electrodes 190 are configured to include a plurality of linear pixel electrode patterns 191, 192, 193, 194, and 195.

The individual pixel electrode patterns are arranged such that they are spaced apart from each other and electrically connected to each other. In this exemplary embodiment, first ends of the pixel electrode patterns are connected to each other, but second ends thereof are not connected to each other and extend in a direction parallel to the data lines. However, the shapes and the arrangement of the pixel electrode patterns are not limited thereto and the pixel electrode patterns may be modified to have various shapes and arrangements.

The common electrodes 160 and the pixel electrodes 190 may include a transparent conductive material, for example, indium tin oxide (ITO) or indium zinc oxide (IZO).

Figure 3A:
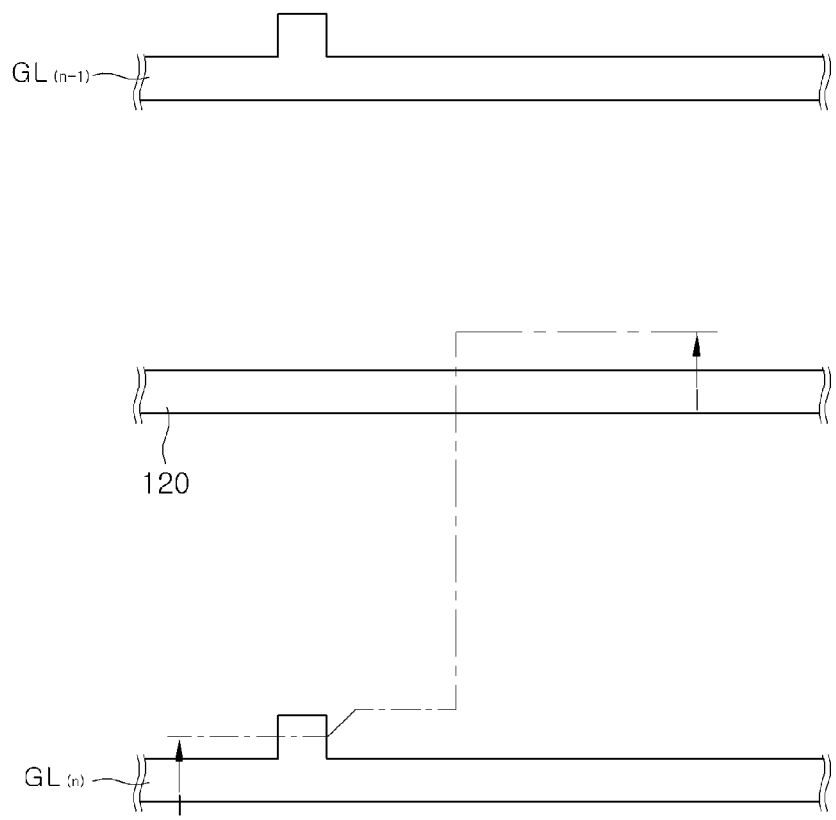
FIG. 3A, FIG. 3B, FIG. 4A, FIG. 4B, FIG. 5A, FIG. 5B, FIG. 6A, FIG. 6B, FIG. 7A, FIG. 7B, FIG. 8A, and FIG. 8B are plan views and cross-sectional views of processes of manufacturing a thin film transistor substrate according to an exemplary embodiment of the invention.
Figure 3B:
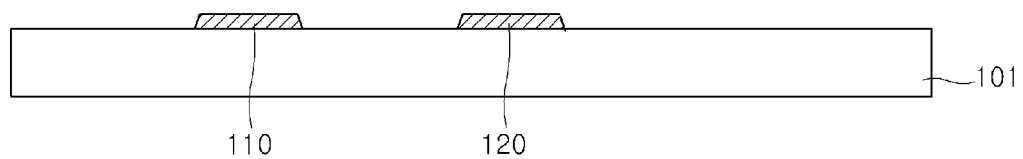

FIG. 3A and FIG. 3B are a plan view and a cross-sectional view, respectively, showing a process of manufacturing a thin film transistor substrate according to an exemplary embodiment of the invention.

Referring to FIG. 3A and FIG. 3B, a first conductive film is disposed on the transparent insulating substrate 101 by a vapor deposition method, such as a chemical vapor deposition (CVD) method, a plasma vapor deposition (PVD) method, or a sputtering method. The first conductive film may be formed of at least one of Cr, MoW, Cr/Al, Cu, Al(Nd), Mo/Al, Mo/Al(Nd), and Cr/Al(Nd). In addition, the first conductive film may be a multi-layer film. A photosensitive film is disposed on the first conductive film and a photolithography process using a first mask (not shown) is performed to form a first photosensitive film mask pattern (not shown). Subsequently, an etching process is performed, using the first photosensitive film mask pattern as an etching mask, to form the gate lines GL, including the gate electrodes 110, and the common voltage lines 120, as shown in FIG. 3A and FIG. 3B. Then, a stripping process is performed to remove the first photosensitive film mask pattern.

Figure 4A:
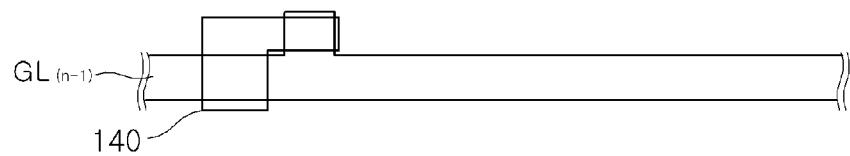
Figure 4A:
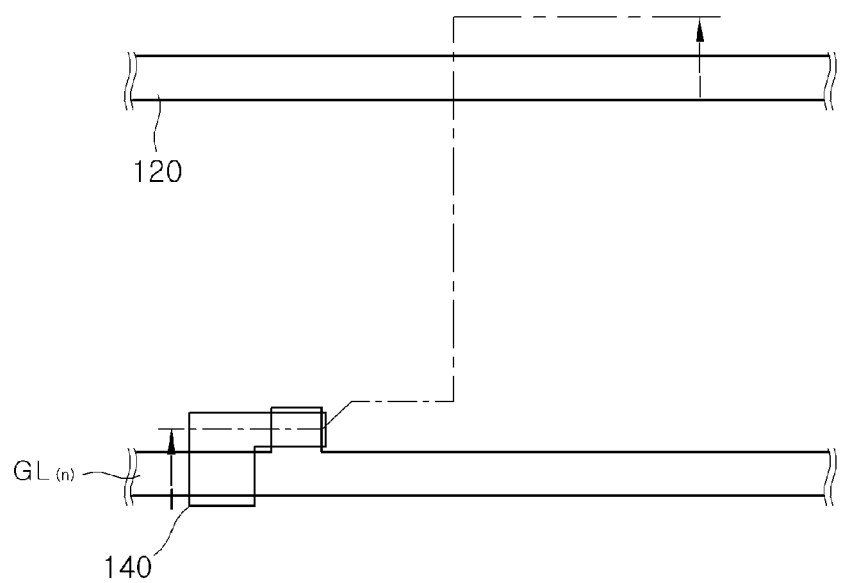
Figure 4B:
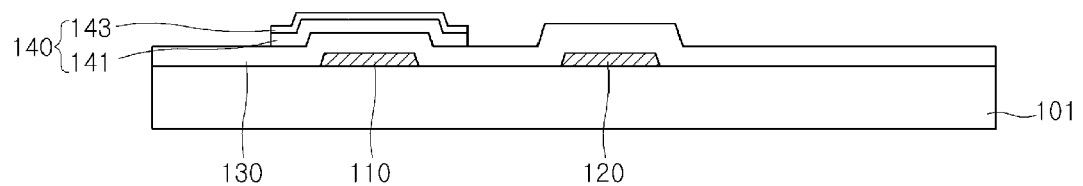

Referring to FIG. 4A and 4B, the gate insulating film 130, the active layer 141, and the ohmic contact layer 143 are sequentially disposed on the substrate, shown in FIG. 3A and FIG. 3B, and an etching process is performed, using a second photosensitive film mask pattern (not shown), to form active regions of the thin film transistors.

The gate insulating film 130 is disposed on the substrate by a vapor deposition method, such as a plasma enhanced chemical vapor deposition (PECVD) method or a sputtering method. In this case, the gate insulating film 130 may be made of an inorganic insulating material, such as a silicon oxide or a silicon nitride. The active layer 141 and the ohmic contact layer 143 are sequentially disposed on the gate insulating film 130 by a vapor deposition method. An amorphous silicon layer may be used as the active layer 141 and an amorphous silicon layer having silicide or n-type impurities heavily doped therein may be used as the ohmic contact layer 143. A photosensitive film is disposed on the ohmic contact layer 143, and a photolithography process using a second mask (not shown) is performed to form a second photosensitive film mask pattern (not shown). Subsequently, an etching process is performed, using the second photosensitive film mask pattern as an etching mask and the gate insulating film 130 as an etch stop layer, to remove the ohmic contact layer 143 and the active layer 141, thereby forming an active region 140 having a predetermined shape above the gate electrode 110. Then, a stripping process is performed to remove the remaining second photosensitive film mask pattern.

Figure 5A:
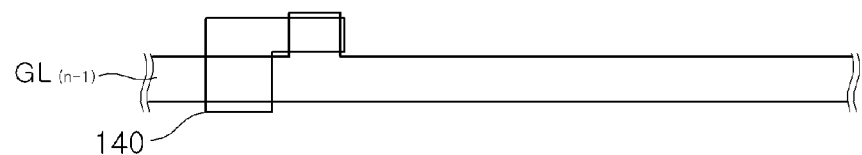
Figure 5A:
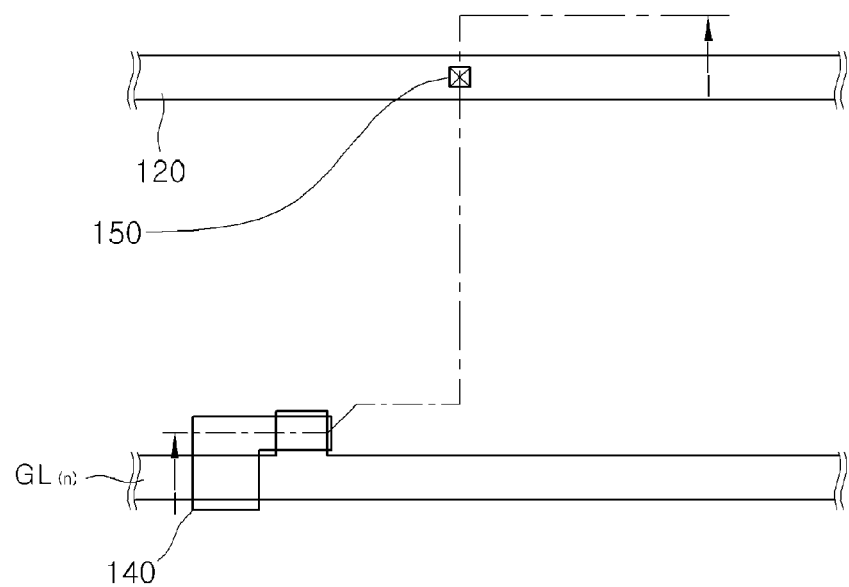
Figure 5B:
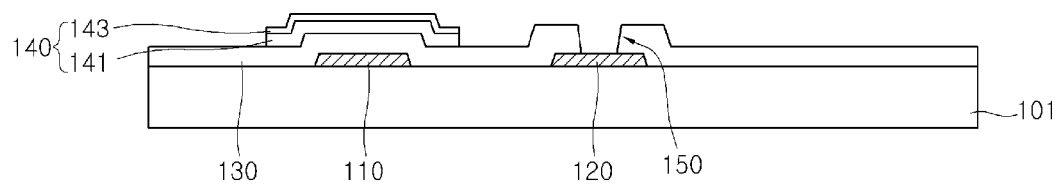

Referring to FIG. 5A and FIG. 5B, a photosensitive film is disposed on the gate insulating film 130 and then a photolithography process, using a third mask (not shown), is performed to form a third photosensitive film mask pattern (not shown). Subsequently, an etching process is performed, using the third photosensitive film mask pattern as an etching mask, to form the first contact hole 150 that exposes a part of the common voltage line 120, in the gate insulating film 130, as shown in FIG. 5A and FIG. 5B. Thereafter, a stripping process is performed to remove the third photosensitive film mask film.

Figure 6A:
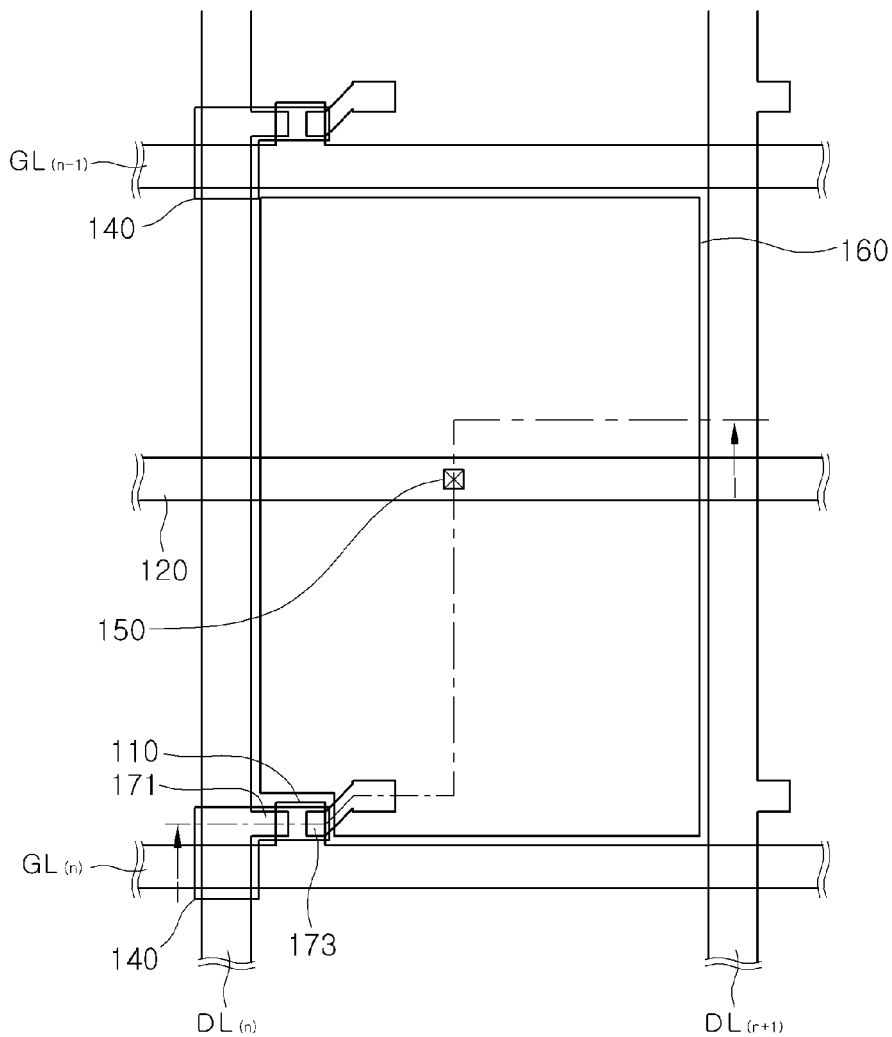
Figure 6B:
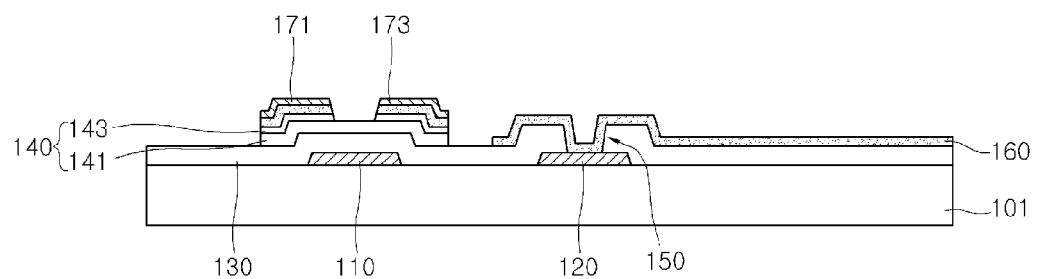

Referring to FIG. 6A and FIG. 6B, a second conductive film and a third conductive film are sequentially disposed on the active region 140 of each thin film transistor and the substrate in which the first contact holes 150 are formed and then an etching process is selectively performed, using a fourth photosensitive film mask pattern (not shown), to form the data lines DL, the source electrodes 171, the drain electrodes 173, and the common electrodes 160.

A second conductive film and a third conductive film may be disposed on the entire substrate by a vapor deposition method, such as a CVD method, a PVD method, or a sputtering method. In this case, since the second conductive film may be used as the common electrode, the second conductive film is preferably made of a transparent conductive material, for example, ITO or IZO. It is further preferable that the third conductive film be made of at least one of Mo, Al, Cr, and Ti, or of the same material as the first conductive film.

A photosensitive film is disposed on the third conductive film and then a photolithography process using a fourth mask (not shown) is performed to form a fourth photosensitive film mask pattern (not shown). A halftone mask or a mask formed of a slit pattern may be used as the fourth mask. As a result of the photolithography process, a fourth photosensitive film mask pattern is formed. The thickness of the fourth photosensitive film mask pattern may vary across different regions of the substrate, i.e., the thickness of the film mask pattern may have one thickness in the vicinity of the common electrode and a different thickness in the vicinity of the data line.

A selective etching process is performed, using the fourth photosensitive film mask pattern as an etching mask, to form a double layered structure. For example, the source electrode 171, the drain electrodes 173, and the data lines DL may be formed by the second conductive film and the third conductive film. The common electrodes may be formed by the second conductive film. The fourth mask forming process will be described with reference to FIG. 9.

Figure 7A:
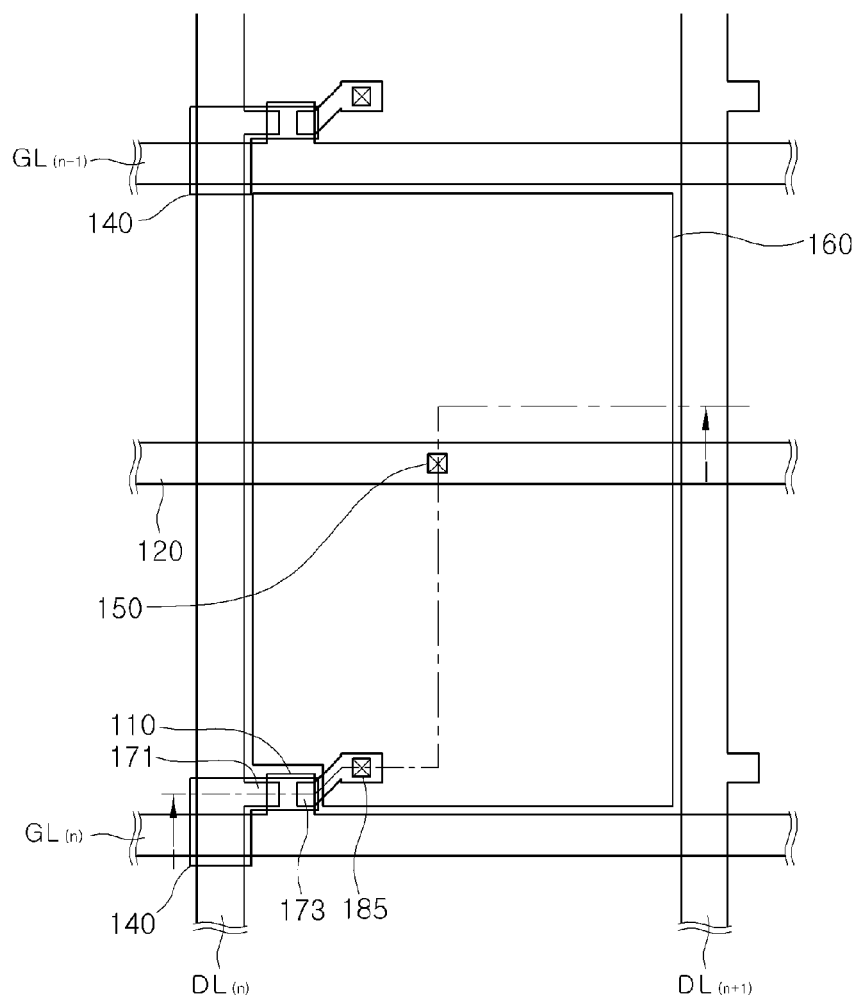
Figure 7B:
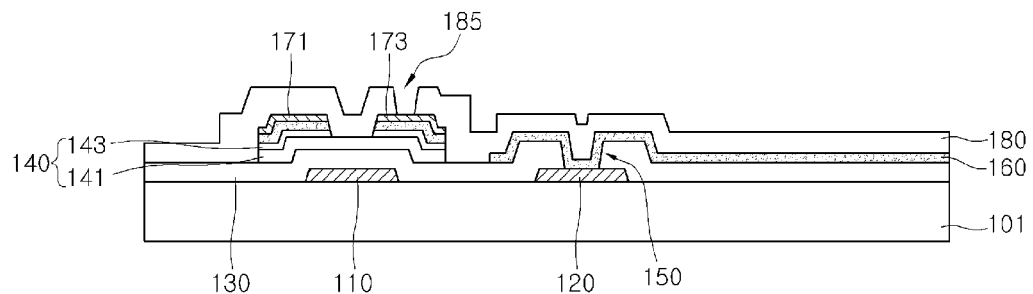

Referring to FIG. 7A and FIG. 7B, the passivation film 180 is disposed on the substrate on which the thin film transistors, the data lines DL and the common electrodes 160 are disposed and a photosensitive film is disposed on the passivation film 180. Thereafter, a photolithography process is performed using a fifth mask (not shown) to form a fifth photosensitive film mask pattern (not shown). An etching process is performed, using the fifth photosensitive film mask pattern, to remove a part of the passivation film 180. Thereby forming the second contact hole 185.

Figure 8A:
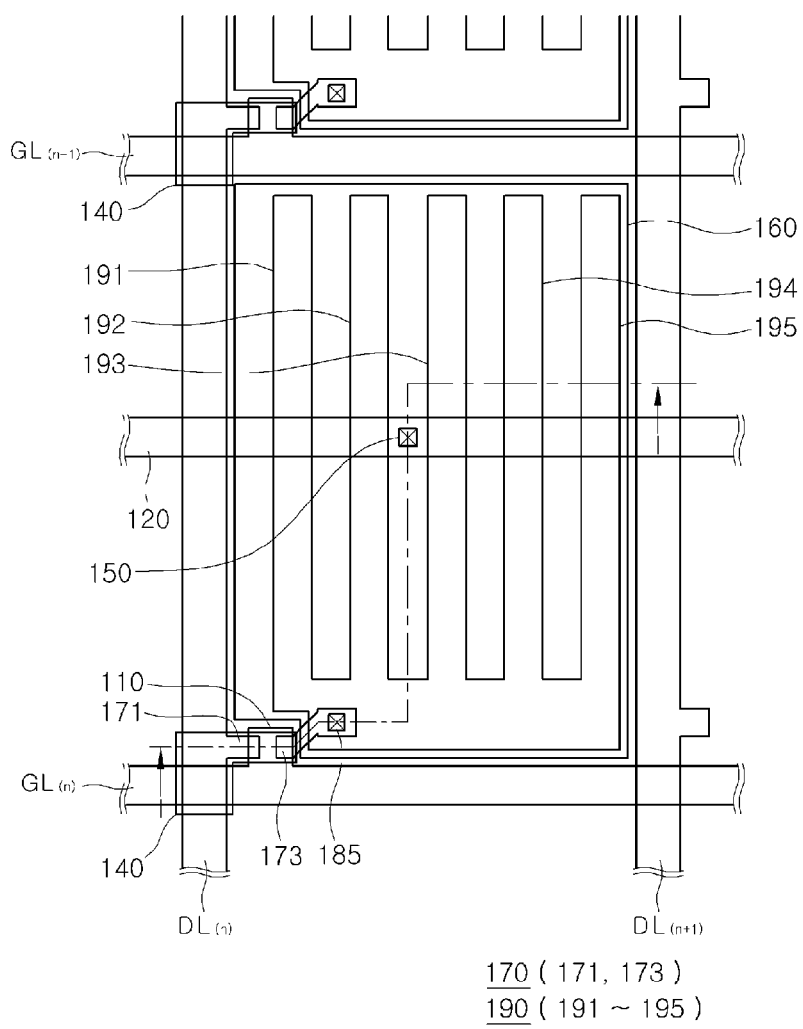
Figure 8B:
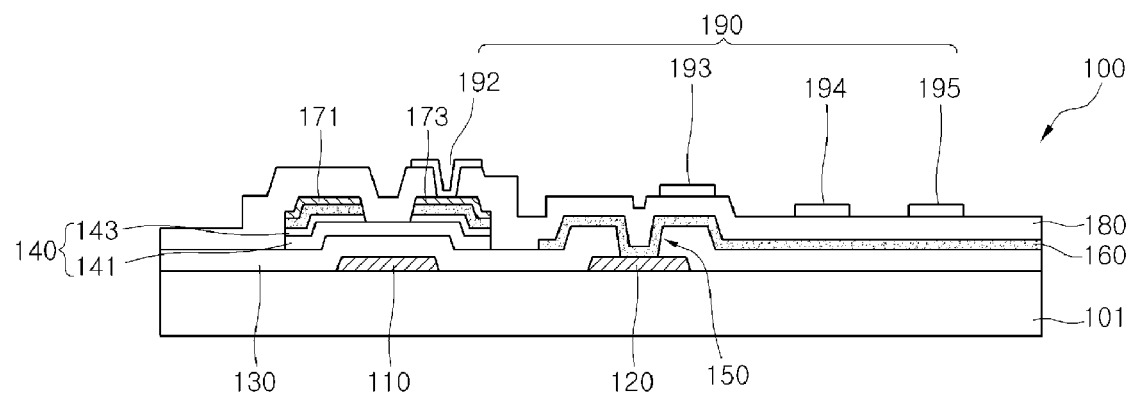

Referring to FIG. 8A and FIG. 8B, a fourth conductive film is disposed on the passivation film 180 and then a sixth photosensitive film mask pattern (not shown) is formed by a photolithography process using a sixth mask (not shown). The fourth conductive film is patterned, using the sixth photosensitive film mask pattern, to form the pixel electrodes 190 having pixel electrode patterns 191, 192, 193, 194, and 195. In this case, the fourth conductive film is preferably made of a transparent conductive material, such as ITO or IZO.

In this embodiment, even though the sixth mask process is exemplified, the process of manufacturing a thin film transistor substrate is not limited to the sixth mask process and can uses various processes.

FIG. 9A, FIG. 9B, FIG. 9C, and FIG. 9D are cross-sectional views showing the fourth mask process in the process of manufacturing the thin film transistor substrate according to an exemplary embodiment of this invention.

Figure 9A:
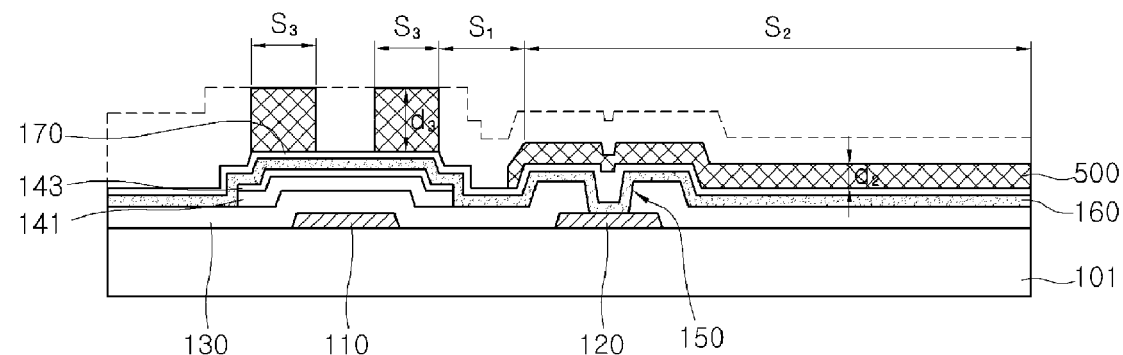
FIG. 9A, FIG. 9B, FIG. 9C, and FIG. 9D are cross-sectional views showing a fourth mask process in the process of manufacturing a thin film transistor substrate according to an exemplary embodiment of the invention.

Referring to FIG. 9A, a photosensitive film is disposed on a substrate on which a second conductive film and a third conductive film are sequentially disposed. Then a photolithography process is performed, using a fourth mask (not shown), to form a fourth photosensitive film mask pattern 500.

In this case, the thickness of the fourth photosensitive film mask pattern 500 may vary across different regions of the substrate. The fourth photosensitive film mask pattern 500 includes an $S_2$ region corresponding to the common electrode region, an $S_3$ region corresponding to the data line (not shown) and a source electrode and a drain electrode of the thin film transistor, and an $S_1$ region corresponding to the remaining region. In this case, when it is assumed that the thickness of the $S_2$ region is $d_2$ and the thickness of the $S_3$ region is $d_3$, the photosensitive film mask pattern is not formed in the $S_1$ region, and $d_3$ is larger than $d_2$.

In order to form the fourth photosensitive film mask pattern 500 such that it has different thicknesses as described above, a halftone mask or a slit pattern mask may be used as the fourth mask (not shown).

Figure 9B:
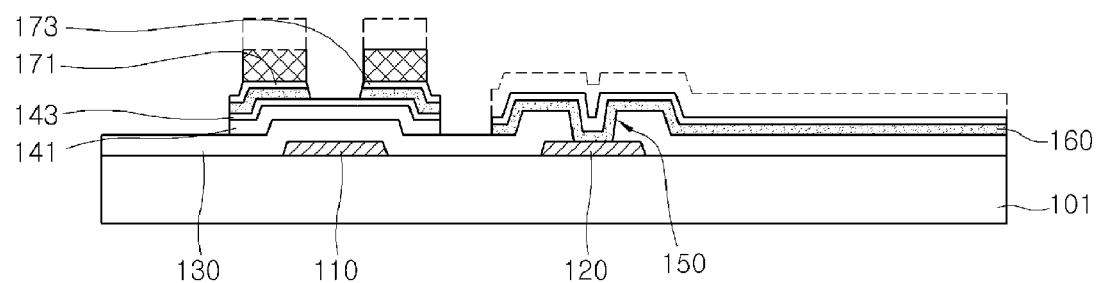

Referring to FIG. 9B, an etching process is performed, using the fourth photosensitive film mask pattern 500 as an etching mask and the gate insulating film 130 as an etch stop layer, and the second conductive film and the third conductive film corresponding to the $S_1$ region are removed to form the data lines (not shown), the source electrodes 171, and the drain electrodes 173.

Referring to FIG. 9B, an ashing process is performed to reduce the total thickness of the fourth photosensitive film mask pattern 500. In this case, the ashing process may be performed using $O_2$ plasma. The ashing process may be continued until the third conductive film in the $S_2$ region is exposed.

Figure 9C:
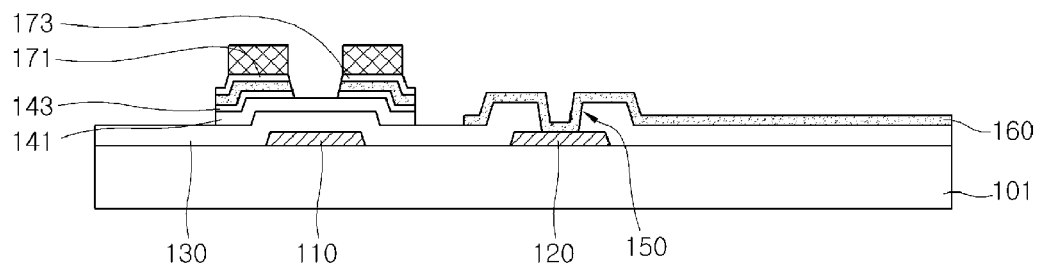

Referring to FIG. 9C, an etching process is performed, using the ashed fourth photosensitive film mask pattern 500 as an etching mask to etch the third conductive film, to form the common electrodes 160. Further, the ohmic contact layer 143 that connects the source electrodes 171 and the drain electrodes 173 in the channel region of the thin film transistor is also etched. In this exemplary embodiment, the etching of the ohmic contact layer 143 is performed after etching the third conductive film. However, the order of the etching process is not limited thereto, and the etching process may be performed after the etching process of FIG. 9B is performed. That is, the ohmic contact layer 143 may be etched after forming the data lines, the source electrodes 171, and the drain electrodes 173.

Figure 9D:
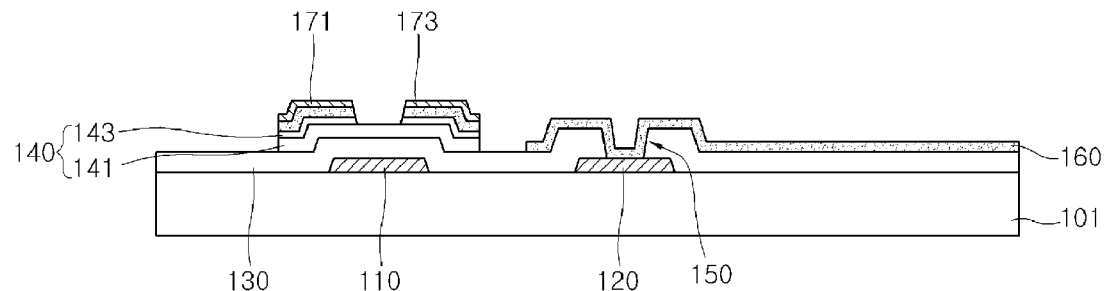

Referring to FIG. 9D, a stripping process is performed to remove a part of the fourth photosensitive film mask pattern that remains on the substrate.

Figure 10:
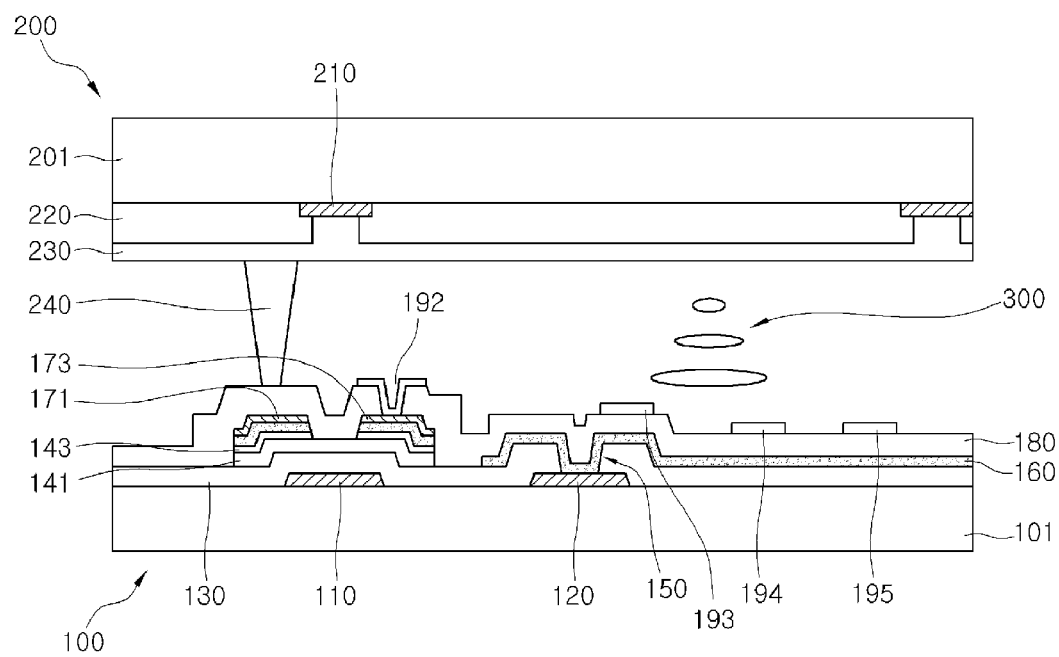
FIG. 10 is a cross-sectional view showing a liquid crystal display panel including the thin film transistor substrate according to an exemplary embodiment of the invention.

FIG. 10 is a cross-sectional view schematically showing a liquid crystal panel including the thin film transistor according to an exemplary embodiment of this invention.

Referring to FIG. 10, the liquid crystal display panel includes a thin film transistor substrate 100, a color filter substrate 200 arranged opposite the thin film transistor substrate 100, a spacer 240 that maintains a cell gap between both substrates, and liquid crystal 300 injected between the substrates. In this case, the color filter substrate 200 includes a transparent insulating substrate 201, a black matrix 210 disposed on the substrate 201, a plurality of color filters 220 disposed on the substrate 201 on which the black matrix 210 is disposed, and an overcoat film 230 disposed on the plurality of color filters 220.

Figure 11:
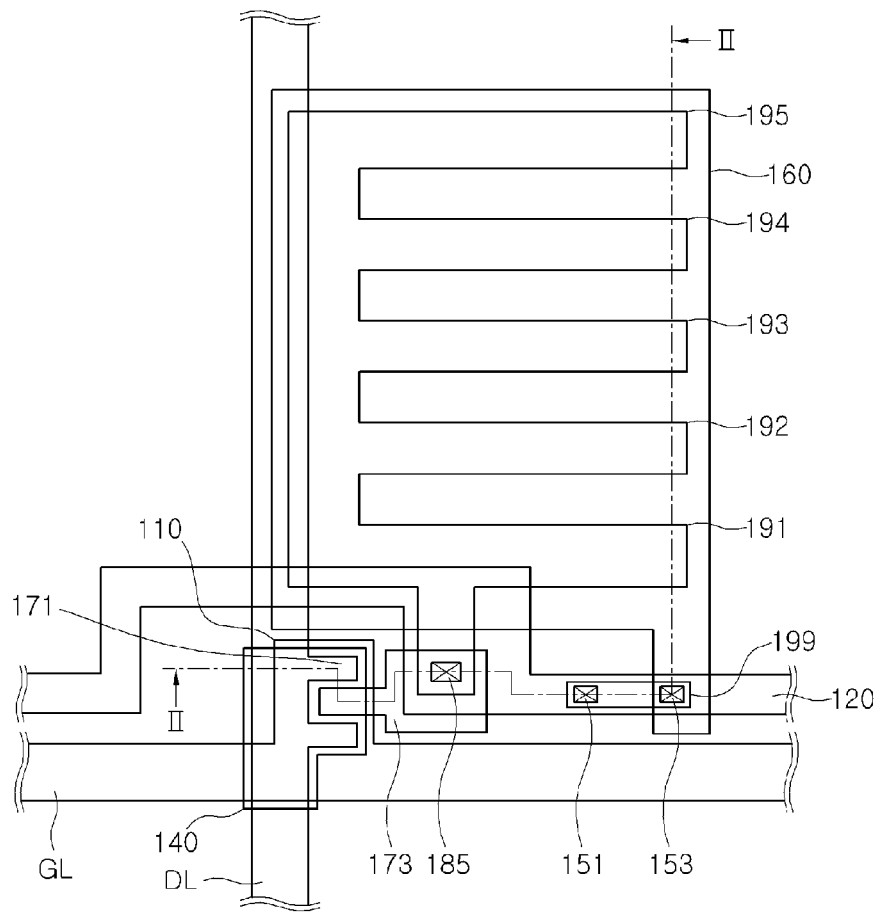
FIG. 11 is a plan view schematically illustrating a thin film transistor substrate according to another embodiment of the invention.
Figure 12:
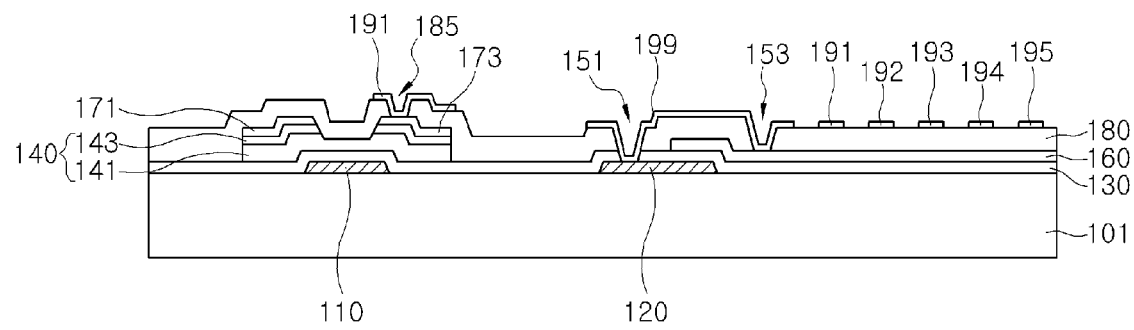
FIG. 12 is a cross-sectional view taken along the line II-II of FIG. 11.

FIG. 11 is a plan view schematically illustrating a thin film transistor substrate according to another embodiment of the invention and FIG. 12 is a cross-sectional view taken along the line II-II of FIG. 11.

Referring to FIGS. 11 and 12, a thin film transistor substrate includes a transparent insulating substrate 101, gate lines GL, data lines DL, common voltage lines 120, a gate insulating film 130, thin film transistors, a first contact hole 151, a second contact hole 153, a common electrode 160, a passivation film 180, a third contact hole 185, and pixel electrodes 191 to 195 and 199. Each of the thin film transistors includes a gate electrode 110, an active region 140, a source electrode 171, and a drain electrode 173.

The gate lines GL are formed on the transparent insulating substrate 101 so as to extend in a horizontal direction, and a gate pad (not shown) is formed at an end of each of the gate lines. The common voltage lines 120 are formed so as to be spaced apart from the gate lines GL. In this embodiment, even though the common voltage lines 120 are formed in the same horizontal direction as the gate lines, the shape and position of the common voltage line 120 is not limited thereto, and may be changed or modified.

The gate insulating film 130 is formed on the gate lines GL and the common voltage lines 120 and the active region 140 that includes an active layer 141 and an ohmic contact layer 143 is formed on the gate insulating film 130.

The data lines DL are formed on the gate insulating film 130 in a vertical direction, and a data pad (not shown) is formed at an end thereof. The source electrode 171 and the drain electrode 173 are formed in the active region 140.

The common electrode 160 is formed in a region of the gate insulating film 130 in which the active region 140 is not formed to have a plane shape such as a square or a rectangle. Further, as described in this embodiment, the common electrode 160 may be formed in a region defined by the gate lines GL and the data lines DL.

Each of the thin film transistors includes the gate electrode 110 connected to the gate line GL, the source electrode 171 connected to the data line DL, the drain electrode 173 connected to the pixel electrode, the gate insulating layer 130 and the active layer 141 that are sequentially formed between the gate electrode 110 and the source and drain electrodes 171 and 173, and the ohmic contact layer 143 that is formed on at least a part of the active layer 141. In this case, the ohmic layer 143 may also be formed on the active layer 141 other than a channel portion.

The passivation film 180 is formed on the thin film transistors and the common electrode 160, and the first contact hole 151 is formed by removing a part of the passivation film 180 and the gate insulating film 130 in order to expose a part of the common voltage lines 120. The second contact holes 153 is formed by removing a part of the passivation film 180 in order to expose a part of the common electrode 160, and the third contact hole 185 is formed by removing a part of the passivation film 180 in order to expose a part of the drain electrodes 173.

The pixel electrodes that are configured by a plurality of pixel electrode patterns 191 to 195 and a bridge electrode pattern 199 are formed on the passivation film 180 in which the first, second, and third contact holes 151, 153, and 185 are formed. The bridge electrode pattern 199 is formed on the first and second contact holes 151 and 153 to connect the common voltage lines 120 and the common electrode 160. Further, the plurality of pixel electrode patterns 191 to 195 are formed on the third contact hole 185 to be connected with the drain electrodes 173 of the thin film transistors.

In this case, the individual pixel electrode patterns 191 to 195 are formed in a line to be spaced apart from each other, and to be electrically connected to each other. In this embodiment, first ends of the pixel electrode patterns are connected to each other, but second ends thereof are not connected to each other and extend in a direction parallel to the gate lines GL. However, the shapes and the arrangement of the pixel electrode patterns are not limited thereto, and may be modified to have various shapes and arrangements.

The common electrode 160 and the pixel electrodes may be formed of a transparent conductive material, for example, ITO (indium tin oxide) or IZO (indium zinc oxide).

Figure 13A:
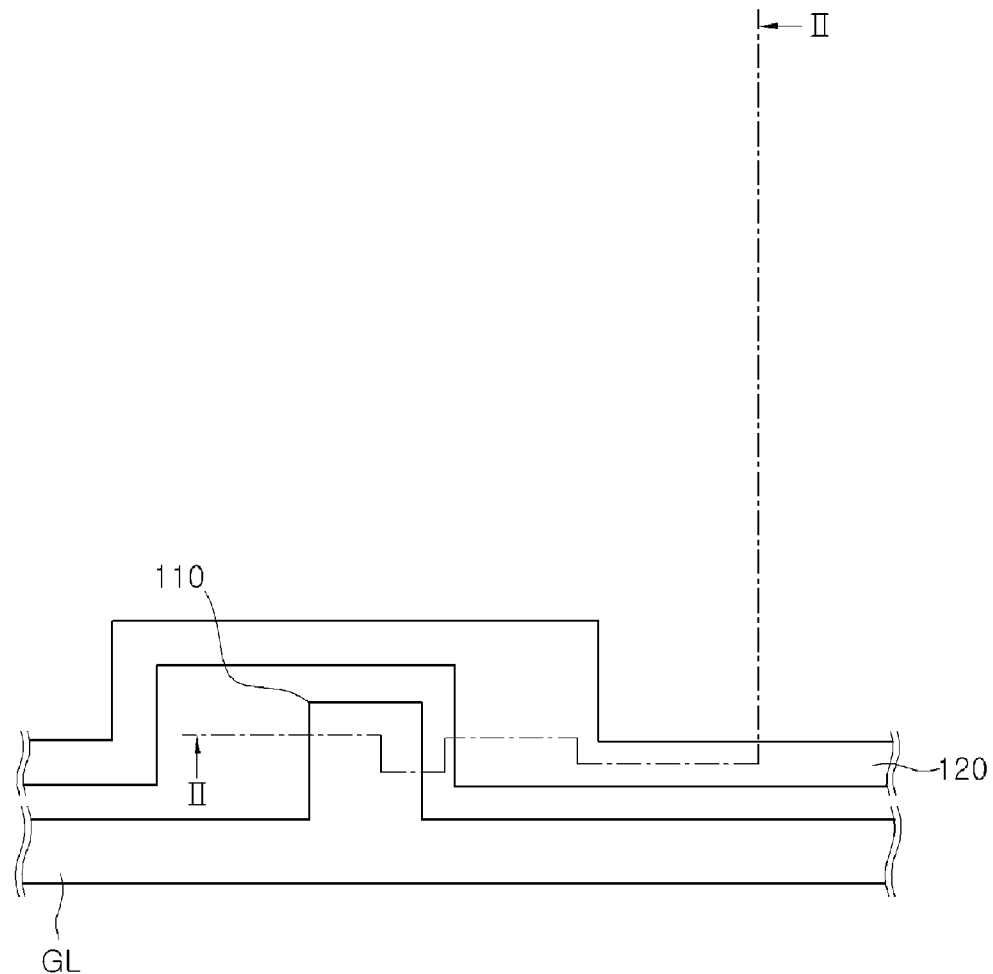
FIGS. 13A to 17B are plan views and cross-sectional views of processes of manufacturing a thin film transistor substrate according to another embodiment of the invention.
Figure 13B:
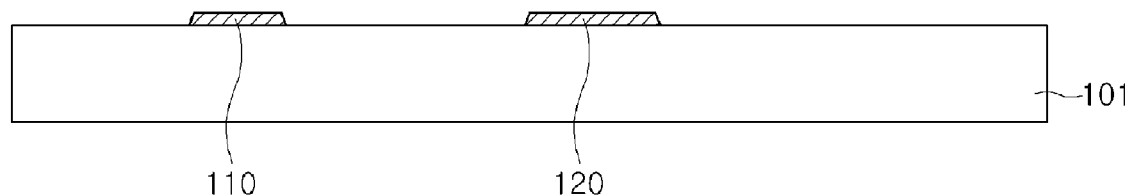

FIGS. 13A and 13B are a plan view and a cross-sectional view illustrating a first mask process, among processes of manufacturing a thin film transistor substrate according to another embodiment of the invention, respectively.

Referring to FIGS. 13A and 13B, a first conductive film is formed on the transparent insulating substrate 101 by a vapor deposition method, such as a CVD method, a PVD method, or a sputtering method. In this case, it is preferable that the first conductive film be formed of at least one selected from Cr, MoW, Cr/Al, Cu, Al(Nd), Mo/Al, Mo/Al(Nd), and Cr/Al (Nd). In addition, the first conductive film may be formed of a multi-layer. Then, a photosensitive film is applied on the first conductive film, and a photolithography process using a first mask (not shown) is performed to form a first photosensitive film mask pattern (not shown). Subsequently, an etching process is performed using the first photosensitive film mask pattern as an etching mask to form the gate lines GL including the gate electrodes 110 and the common voltage lines 120, as shown in FIGS. 13A and 13B. Then, a strip process is performed to remove the first photosensitive film mask pattern.

Figure 14A:
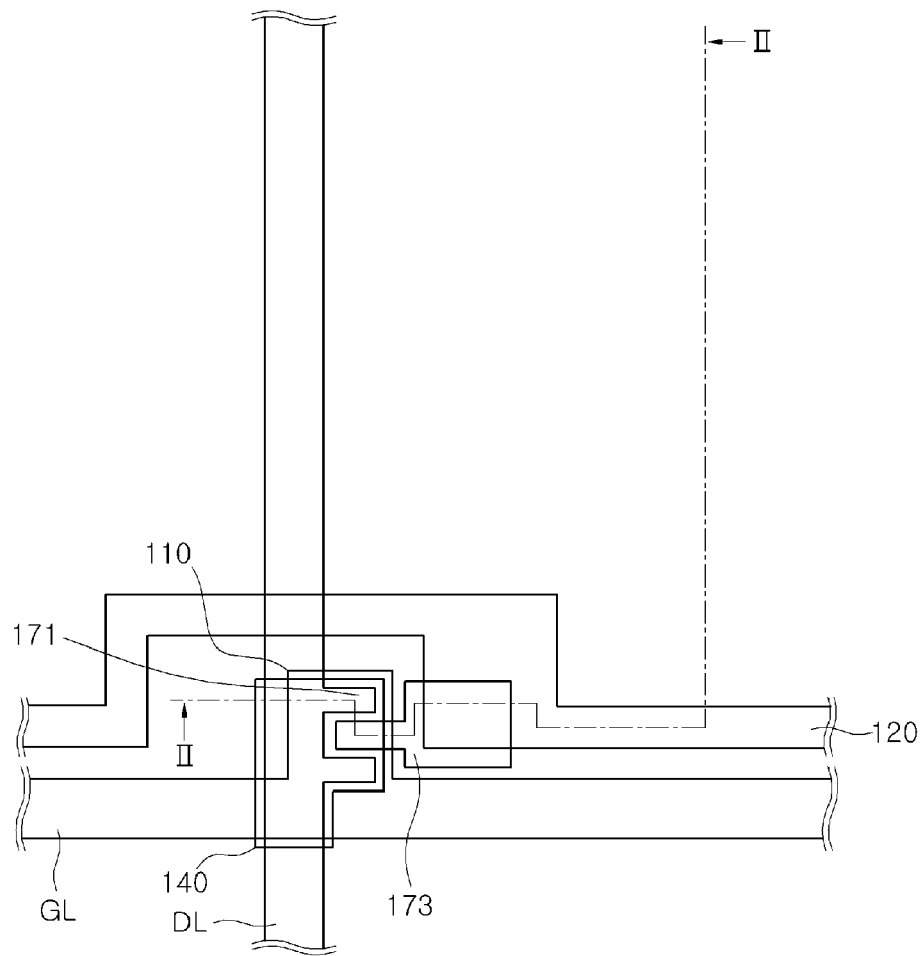
Figure 14B:
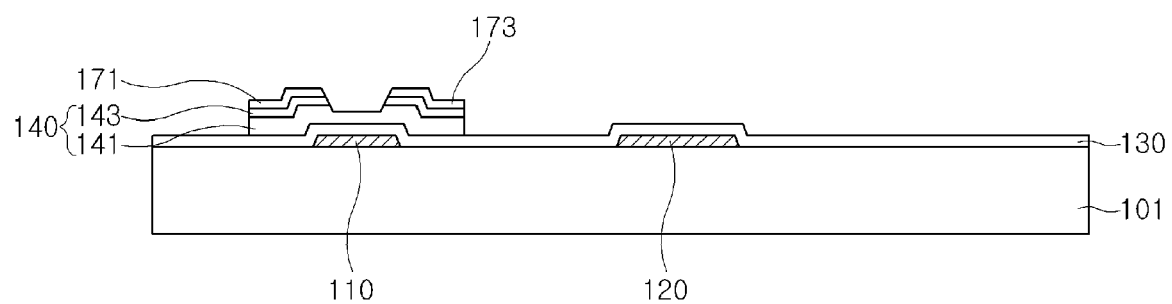

FIGS. 14A and 14B are a plan view and a cross-sectional view illustrating a second mask process, among processes of manufacturing a thin film transistor substrate according to another embodiment of the invention.

Referring to FIGS. 4A and 4B, the gate insulating film 130, the active layer 141, the ohmic contact layer 143, and the second conductive film are sequentially formed on the substrate shown in FIGS. 13A and 13B, and then a photolithography process is performed using a second mask (not shown) to form a second photosensitive film mask pattern (not shown). An etching process is performed using the second photosensitive mask pattern to form the active region 140 of the thin film transistor and the data lines DL including the source electrodes 171 and the drain electrodes 173.

The gate insulating film 130, the active layer 141, and the ohmic contact layer 143 are sequentially deposited on the transparent insulating substrate 101 on which the gate lines GL including the gate electrodes 110 and the common voltage lines 120 are formed, and then the second conductive film is deposited thereon. In this case, the gate insulating film 130 may be formed of an inorganic insulating material including a silicon oxide or a silicon nitride. An amorphous silicon layer is used as the active layer 141, and an amorphous silicon layer having silicide or n-type impurities heavily doped therein is used as the ohmic contact layer 143.

According to this embodiment, the second mask forms a region corresponding to the channel region of the thin film transistor to have a slit shape or to be a transflective region. When the photolithography process is performed by using such a second mask, the channel region of the thin film transistor is insufficiently exposed. Therefore, after a developing process, a second photosensitive mask pattern that remains in the channel region of the active region is thicker than that of other regions.

The second conductive film, the ohmic contact layer 143, and the active layer 141 are sequentially etched using the second photosensitive mask patterns having different thickness to form the data lines DL including the source electrodes 171 and the drain electrodes 173 and the active region 140, simultaneously. Thereafter, when the second photosensitive mask pattern that is formed in the channel region and is thinner than the other pattern is etched-back, only a pattern that removes the second conductive film in the channel region of the thin film transistor remains. Thereafter, after etching the second conductive film in the channel region, a pattern is removed, and the ohmic contact layer 143 is etched back using the source electrodes 171 and the drain electrodes 173 as masks.

Figure 15A:
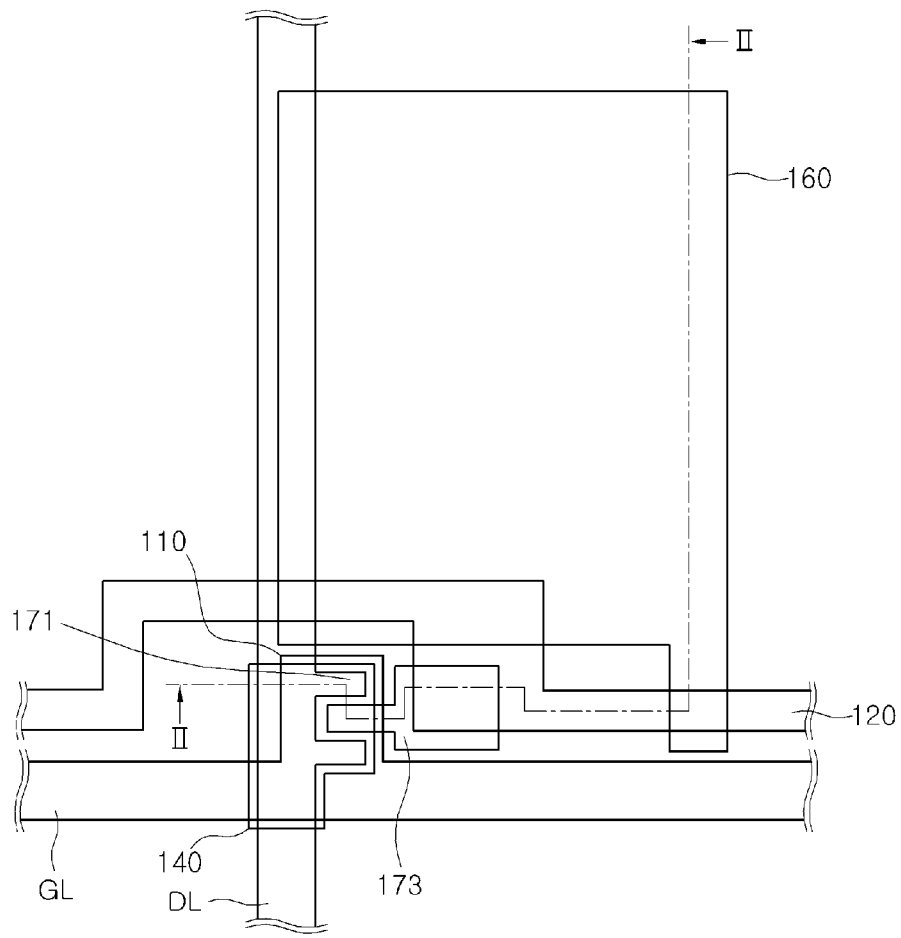
Figure 15B:
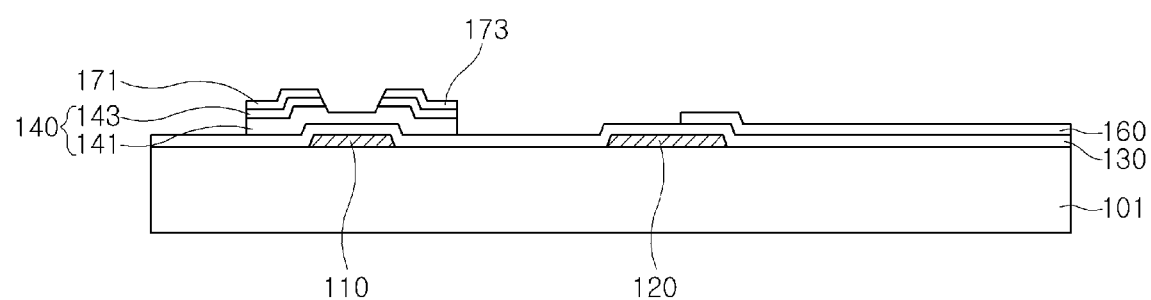

FIGS. 15A and 15B are a plan view and a cross-sectional view illustrating a third mask process, among processes of manufacturing a thin film transistor substrate according to another embodiment.

Referring to FIGS. 15A and 15B, a third conductive film is formed on the substrate shown in FIGS. 14A and 14B. In this case, since the third conductive film is used as a common electrode, the third conductive film may be formed of a transparent conductive material such as ITO (Indium Tin Oxide) or IZO (Indium Zinc Oxide). Thereafter, a photosensitive film is applied thereon, and then a photolithography process using a third mask (not shown) is performed to form a third photosensitive film mask pattern (not shown). Subsequently, an etching process is performed, using the third photosensitive film mask pattern as an etching mask to form the common electrode 160 as shown in FIGS. 15A and 15B. The common electrode 160 is formed in a region defined by the gate lines GL and the data lines DL to have a plane shape. Thereafter, a strip process is performed to remove the third photosensitive mask pattern.

Figure 16A:
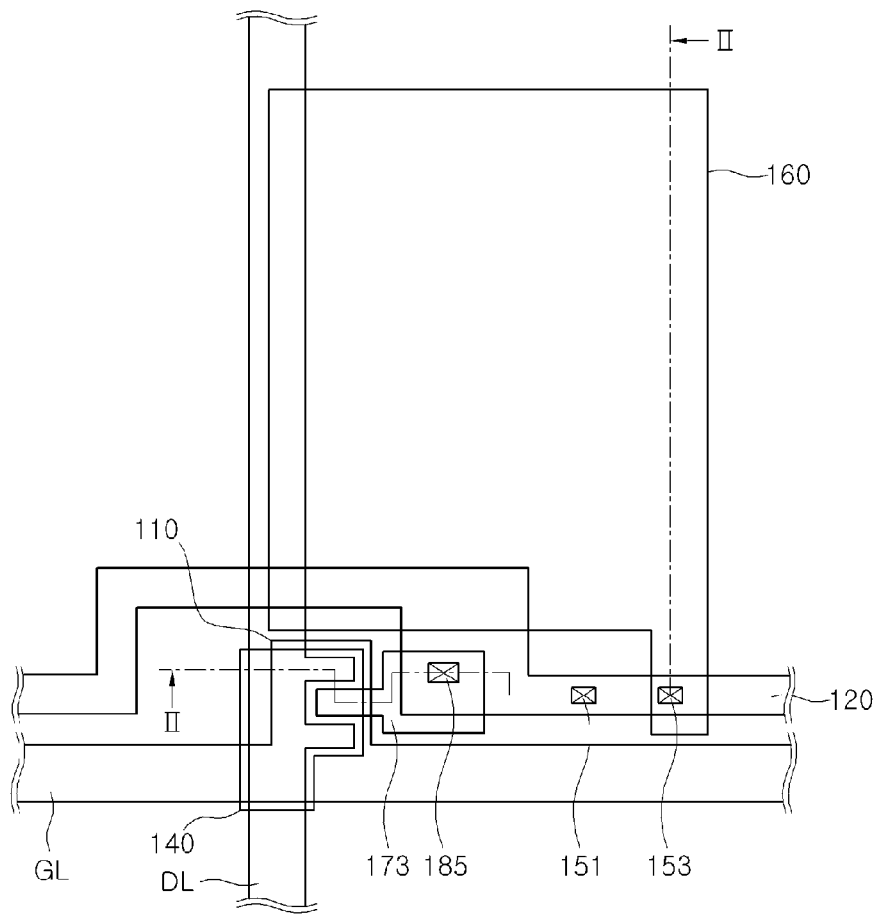
Figure 16B:
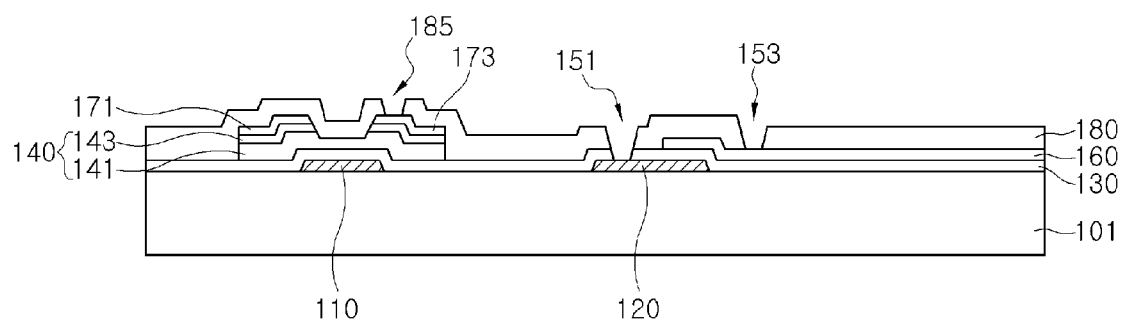

FIGS. 16A and 16B are a plan view and a cross-sectional view illustrating a fourth mask process, among processes of manufacturing a thin film transistor substrate according to another embodiment Referring to FIGS. 16A and 16B, the passivation film 180 is formed on the substrate on which the thin film transistors, the data lines DL, and the common electrode 160 are formed, and a photoresist film is applied on the passivation film 180 to form a fourth photosensitive film mask pattern (not shown) by means of a photolithography process using a fourth mask (not shown). A part of the passivation film 180 is removed by an etching process using the fourth photosensitive mask pattern to form the second contact hole 153 and the third contact hole 185. Further, a part of the passivation film 180 and the gate insulating film 130 are removed to form the first contact hole 151. Thereafter, a strip process is performed to remove the fourth photosensitive film mask pattern.

Figure 17A:
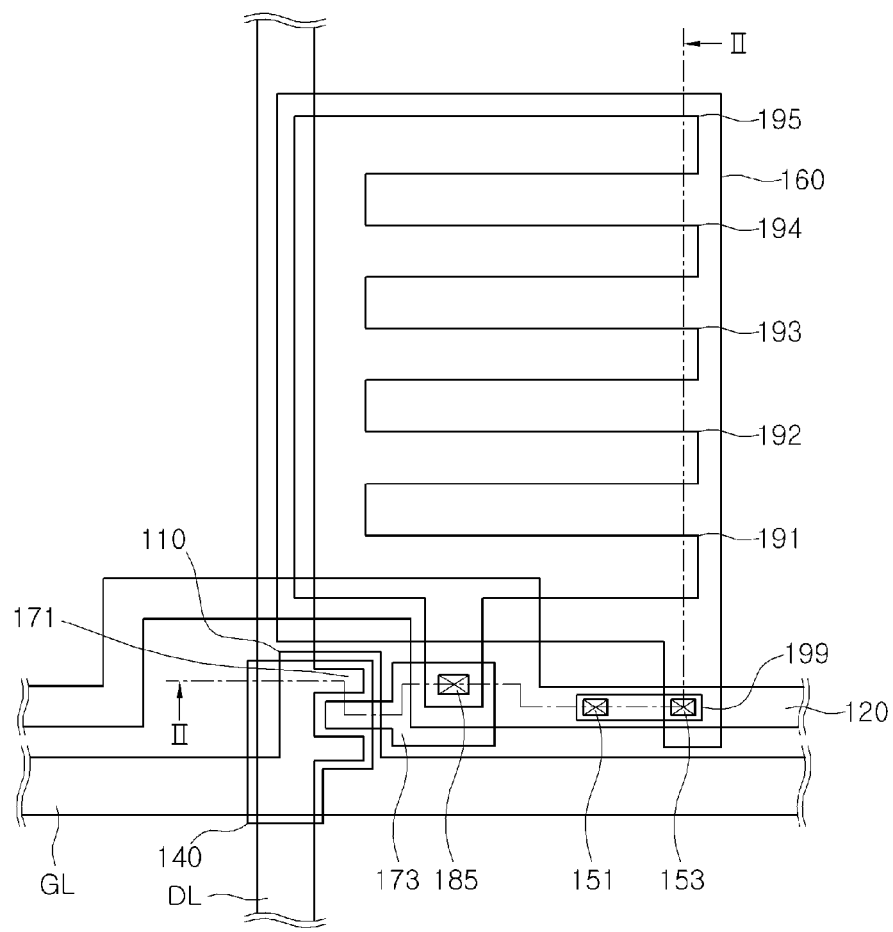
Figure 17B:
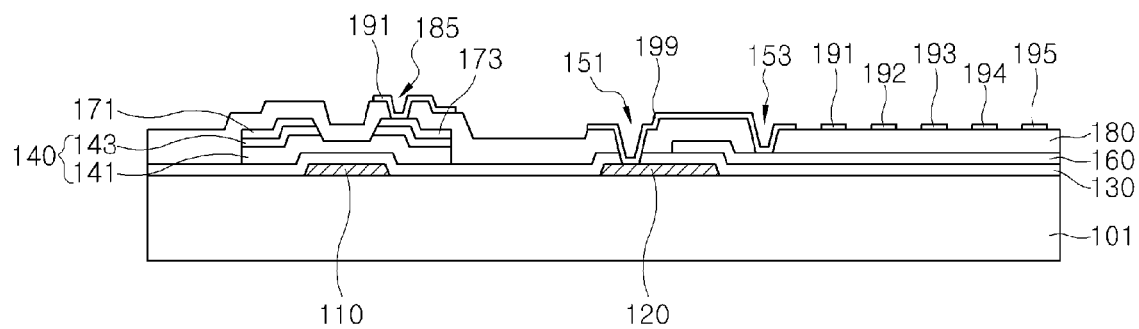

FIGS. 17A and 17B are a plan view and a cross-sectional view illustrating a fifth mask process, among processes of manufacturing a thin film transistor substrate according to another embodiment.

Referring to FIGS. 17A and 17B, a fourth conductive film is formed on the passivation film 180, and then a photolithography process is performed using a fifth mask (not shown) to form a fifth photosensitive mask pattern (not shown). The fourth conductive film is patterned by using the fifth photosensitive mask pattern to form the pixel electrodes configured by the pixel electrode patterns 191 to 195 and the bridge electrode pattern 199. In this case, the fourth conductive film may be formed of a transparent conductive material including ITO or IZO. A part of the pixel electrode patterns 191 to 195 is formed on the third contact hole 185 to be connected to the drain electrodes 173 of the thin film transistors, and the bridge electrode pattern 199 is formed on the first contact hole 151 and the second contact hole 153 to connect the common voltage lines 120 and the common electrode 160.

Thereafter, a strip process is performed to remove the fifth photosensitive mask pattern.

In this embodiment, even though five mask processes are exemplified, the process of manufacturing a thin film transistor substrate is not limited thereto, but may be changed or modified.

Figure 18:
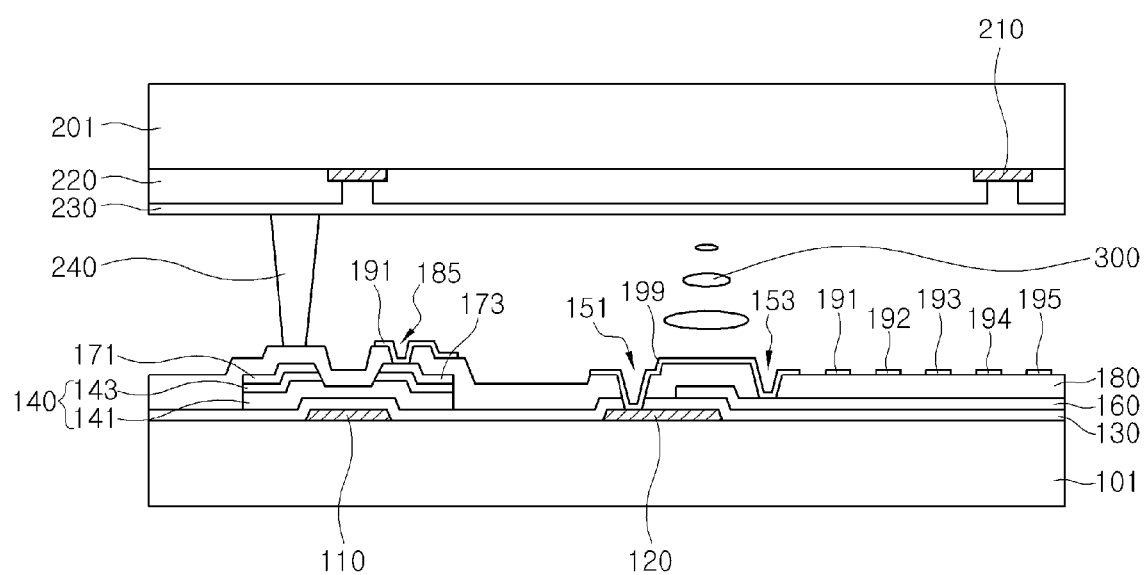
FIG. 18 is a cross-sectional view schematically illustrating a liquid crystal display panel including a thin film transistor substrate according to another embodiment of the invention.

FIG. 18 is a cross-sectional view schematically illustrating a liquid crystal panel including the thin film transistor according to the above embodiment of this invention. Since a thin film transistor substrate of the liquid crystal display panel shown in FIG. 18 has the same configuration as shown in FIGS. 11 and 12, the description thereof will be omitted.

Referring to FIG. 18, the liquid crystal panel includes the thin film transistor substrate, a color filter substrate arranged opposite to the thin film transistor substrate, a spacer 240 that maintains a cell gap between both substrates, and liquid crystal 300 injected between the substrates. In this case, the color filter substrate includes a transparent insulating substrate 201, a black matrix 210 formed on the substrate 201, a plurality of color filters 220 formed on the substrate 201 on which the black matrix 210 is formed, and an overcoat film 230 formed on the plurality of color filters 220.

Although the thin film transistor substrate, the method of manufacturing the thin film transistor substrate, and the liquid crystal display panel including the thin film transistor substrate according to the invention have been described above, these are just illustrative examples. The invention is not limited thereto, but rather, is defined by the appended claims.

As described above, according to the invention, three layers, including a gate insulating film, an active layer, and an ohmic contact layer are deposited on the substrate and then the common electrodes are formed. Therefore, even though the three films may be deposited at a high temperature, the common electrode is not exposed to the high temperature. As a result, the bonding strength between the inner compositions of the common electrode may be maintained, and the interface properties of the three layers, may also be maintained. Thus, the reliability of the thin film transistor substrate may be improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing a thin film transistor substrate, comprising;
    forming gate lines extending in a first direction on a substrate and comprising gate electrodes;
    forming common voltage lines on the substrate such that are spaced apart from the gate lines;
    sequentially forming a gate insulating film, an active layer, and an ohmic contact layer on the gate lines and the common voltage lines to form active regions of thin film transistors;
    forming first contact holes in the gate insulating film, the first contact holes exposing a part of each common voltage line;
    disposing data lines, drain electrodes, and common electrodes on the substrate, the data lines extending in a second direction crossing the gate lines and comprising source electrodes and the common electrodes being connected to the common voltage lines through the first contact holes;
    forming a passivation film on the data lines, the common voltage lines, and the common electrodes, the passivation film comprising second contact holes exposing a part of each drain electrode; and
    forming pixel electrodes on the substrate, the pixel electrodes being connected to the drain electrodes through the second contact holes,
    wherein the passivation film contacts the drain electrode.

2. The method of claim 1, wherein the common electrodes have a plane shape.

3. The method of claim 2, wherein the common electrodes are disposed at crossings of the gate lines and the data lines.

4. The method of claim 1, wherein the pixel electrodes comprise a plurality of pixel electrode patterns, the pixel electrode patterns being linear, spaced apart from each other, and connected to each other.

5. The method of claim 4, wherein first ends of the respective pixel electrode patterns are connected to each other.

6. The method of claim 4, wherein the pixel electrode patterns extend in a direction parallel to the data lines.

7. The method of claim 1, wherein forming the data lines, the drain electrodes, and the common electrodes comprises:
    sequentially forming a conductive film for the common electrodes and a conductive film for the data lines;
    forming a photosensitive film mask pattern on the conductive film for the common electrodes, the photosensitive film mask pattern varying in thickness in different regions of the substrate; and
    selectively etching the conductive film for the common electrodes and the conductive film for the data lines using the photosensitive film mask pattern.

8. The method of claim 7, wherein the forming of the photosensitive film mask pattern varying in thickness in different regions of the substrate comprises forming photosensitive film mask patterns such that the thickness of the photosensitive film mask pattern corresponding to the common electrodes is smaller than the thickness of the photosensitive film mask pattern corresponding to the data lines.

9. The method of claim 7, wherein the forming of the photosensitive film mask pattern varying in thickness in different regions of the substrate comprises forming a photosensitive film mask pattern using a mask formed of a halftone mask or a slit pattern mask.

* * * * *